United States Patent [19]
Choi et al.

[11] Patent Number: 5,952,952
[45] Date of Patent: Sep. 14, 1999

[54] SWITCHED-CAPACITOR ARRAY

[75] Inventors: Hee-Cheol Choi, Seoul; Geun-Soon Kang, Kyunggi-do, both of Rep. of Korea

[73] Assignee: Samsung Electronics Co., Ltd., Rep. of Korea

[21] Appl. No.: 09/097,935

[22] Filed: Jun. 16, 1998

[30] Foreign Application Priority Data

Jun. 17, 1997 [KR] Rep. of Korea ...................... 97-25197

[51] Int. Cl.$^6$ .................................................. H03M 1/12
[52] U.S. Cl. .................................................. 341/172
[58] Field of Search .................................... 341/108, 126, 341/127, 131, 150, 153, 155, 172; 323/364; 363/59, 60

[56] References Cited

U.S. PATENT DOCUMENTS

| | | |
|---|---|---|
| 4,200,863 | 4/1980 | Hodges et al. .................. 340/247 AD |
| 4,517,549 | 5/1985 | Tsukakoshi ...................... 340/347 AD |
| 4,876,544 | 10/1989 | Kuraishi .................................. 341/166 |
| 4,937,578 | 6/1990 | Shioda .................................... 341/150 |
| 4,975,701 | 12/1990 | Babanezhad et al. .................. 341/139 |
| 5,608,345 | 3/1997 | Macbeth et al. ........................ 327/337 |
| 5,684,487 | 11/1997 | Timko .................................... 341/172 |

*Primary Examiner*—Matthew Nguyen
*Attorney, Agent, or Firm*—Lappin & Kusmer LLP

[57] ABSTRACT

A binary-weighted capacitor array is applicable for use in analog-to-digital or digital-to-analog converters, switched-capacitor filters, etc. A plurality of unit capacitors are arranged in a lateral row. The row is laid out in parallel to a switch array so that each metal interconnect between a unit capacitor and a corresponding switch is of a uniform length. This layout eliminates several limitations commonly found in capacitor arrays, including: top-plate parasitic error due to metal interconnections and metal overlap; ratio error due to oxide thickness gradients; and edge-definition errors.

17 Claims, 6 Drawing Sheets

SWITCHED-CAPACITOR ARRAY

FIELD OF THE INVENTION

The present invention relates to a switched-capacitor array and, more particularly, to a binary-weighted capacitor array suitable for use in charge redistribution analog-to-digital or digital-to-analog converters, switched-capacitor filters, and the like.

BACKGROUND OF THE INVENTION

Binary-weighted capacitor arrays or ladders are commonly employed in analog-to-digital converters, digital-to-analog converters, switched-capacitor filters, and the like. The ratio accuracy, matching, and tracking requirements for capacitor ladders are similar to those associated with resistor ladders of comparable bit resolution. Capacitor ladders comprise a plurality of capacitors, arranged in a parallel combination of binary-weighted component values. Capacitor structures commonly employed in capacitor ladders include conventional metal oxide semiconductors (MOS) structures or double-polysilicon (i.e., polysilicon-oxide-polysilicon) structures. With MOS technology, it is relatively straightforward to realize capacitors of precise capacitance values. Junction capacitors are not suitable for charge-scaling applications due to relatively poor matching characteristics and voltage dependence.

The requirements for capacitor ladders are virtually identical to those for switched-capacitor filters; namely, accurate control of capacitor ratios and minimization of the effects of bottom-plate parasitics. The ratio accuracy is optimized by forming arrays of identical unit-geometry capacitors, which are then interconnected to obtain the desired ratios. The effect of bottom-plate parasitics are minimized by coupling the bottom plates to a voltage source. For example, the potential of the bottom plates can be switched between ground and a reference voltage, whereas the top plates thereof can be connected together to a common output bus.

Capacitors forming an array are generally designed to optimize ratio matching. Deviance from ratio matching, i.e. ratio error, stems from three sources: (1) edge definition of the masking process; (2) top-plate parasitics due to metal interconnections and metal overlap over applied dielectric oxide; and (3) oxide thickness gradients across a chip. The limitation of edge-definition associated with the photomasking process contributes an error of approximately 0.1–0.2 micron uncertainty in the capacitor length and width dimensions. Normally, the relative uncertainty ($\Delta X$) placed in any edge dimension is relatively well-fixed by process tolerances. To minimize the effect of this uncertainty, the capacitor length (L) and width (W) ratios are normally chosen to be equal, and the capacitors are laid out as square sections, as shown in FIG. 1.

If direct area scaling is used to set the capacitor ratios, as shown in FIG. 1, the capacitor ratios become increasingly sensitive to the edge-definition error $\Delta X$ as the capacitor area is reduced. This can be avoided by using the capacitor array approach shown in FIG. 2, where the capacitor ratios are scaled by interconnecting a number of capacitors of identical unit capacitance value. In this approach, edge-definition errors have a negligible effect on the ratio accuracy, since both the area and the periphery ratios are scaled simultaneously. The effect of top-plate parasitics due to interconnection lines can also be accounted for by proper scaling of the interconnection line lengths and widths between capacitors.

Top-plate edge parasitics are generated where there is a slight metal overlap of the top plate over the field dielectric, or where there is an undercutting of the mask which defines the capacitor. Another source of capacitor ratio accuracy error is due to the presence of long-range thickness gradients in the thin dielectric oxide. These gradients arise from non-uniform oxide growth conditions. If variation in oxide thickness is approximated as a first-order gradient, then the resulting ratio error is proportional to the fractional variation in oxide thickness. The oxide thickness gradients can vary as much as ±10 to ±100 parts per million (ppm) per millimeter of dimensional length along the chip surface.

The effects of these long-range gradients can be mitigated by using a common-centroid geometry in the layout and interconnection of the capacitor array. This is illustrated in FIG. 3, in which the elements of the capacitors are positioned such that they are symmetrically spaced about a common center point. For example unit capacitor elements 92A, 92B, 92C, 92D, contributing to the capacitance of capacitor C4, are positioned about central capacitor C1; as are unit capacitor elements 94A, 94B, which contribute to the capacitance of capacitor C2. In this manner, the capacitor ratio accuracy (i.e., the ratio between C1, C2, and C4) can still be maintained in spite of first-order gradients in the capacitor oxide thickness.

FIG. 4 is a schematic diagram illustrating a common-centroid layout of a capacitor array. As shown, among a bank of thirty capacitors 20, nine capacitors (within dashed line 10) are connected to nine corresponding switches 30 through metal lines 40, respectively. The remaining capacitors 11 and metal lines 41 are dummy capacitors and dummy metal lines, respectively. The dummy capacitors 11 are not used, but the dummy metal lines 41 are provided for minimizing the top-plate parasitic error.

Even though it nearly eliminates ratio error arising from the top-plate parasitic components due to metal overlap, the common-centroid layout does not reduce the top-plate parasitic components due to metal interconnections to a sufficient degree. Also, the common-centroid layout becomes cumbersome and wasteful of chip surface area if a higher order of symmetry is required. Therefore, this configuration is normally limited to the first several bits (low-order bits) of the capacitor ladder. As MOS technology advances, and capacitor sizes become smaller, the top-plate parasitics become more significant because, with such a high integration density, the parasitic capacitance may become larger in magnitude than the capacitance of a unit capacitor.

SUMMARY OF THE INVENTION

It is therefore an object of the present invention to provide a switched-capacitor array adapted for minimizing capacitor top-plate parasitics due to metal interconnections and due to metal overlap.

It is another object of the present invention to provide an improved switched-capacitor array with a relatively simple layout structure and reduced consumption of chip surface area.

It is yet another object of the present invention to provide a switched-capacitor array feasible for use in binary-weighted capacitor array and unit capacitor array implementations and facilitated by simple wiring variations.

It is yet another object of the present invention to provide an analog-to-digital converter with reduced capacitor top-plate parasitics and reduced chip surface area.

In order to attain the above objects, according to a first aspect of the present invention, a switched-capacitor array includes a plurality of switches arranged along a first linear row. A like plurality of capacitors are arranged along a second linear row extending substantially parallel to the first linear row. A like plurality of interconnection lines of substantially uniform length are coupled between a corresponding switch and a corresponding unit capacitor. With lines of uniform length, ratio error arising from top-plate parasitics due to variations in the lengths of metal interconnections is mitigated and/or eliminated.

In a preferred embodiment, the interconnection lines extend in a direction substantially transverse to the first and second rows. Coupling lines preferably extend in a direction parallel to the first and second rows for selectively coupling groups of said switches. The coupling lines are preferably positioned between the first and second rows. The switches and capacitors are preferably formed of MOS or BICMOS devices. Two or more of said switches can be coupled together depending on a desired capacitance such that the capacitor array is operable as a binary-weighted capacitor array. The capacitor array is applicable to analog-to-digital converters, digital-to-analog converters, and switched-capacitor filters. The switched-capacitor array may further include at least two secondary capacitors positioned on both sides of the capacitor array.

In a second aspect of the present invention, a pipelined multi-stage analog-to-digital converter including a plurality of stages for analog-to-digital conversion is provided. Each stage includes a low resolution analog-to-digital converter for receiving an analog input signal and providing an $N_i$-bit digital signal, a low resolution digital-to-analog converter for converting the $N_i$-bit digital signal into a subtrahend analog signal by using a reference potential, a switched-capacitor array for reducing the analog input signal by the subtrahend signal, a residue amplifier for amplifying the reduced analog input signal, and a sample and hold circuit for sampling and holding the amplified signal and providing the sampled signal to next stage. The switched-capacitor array includes a plurality of switches arranged in series in a predetermined direction, an array of a plurality of capacitors arranged in series in the predetermined direction, and a plurality of interconnection lines each of which is coupled between a corresponding switch and a corresponding unit capacitor. The unit capacitors are preferably provided in the same size.

According to this invention, top-plate parasitic error due to metal interconnections and metal overlap over the dielectric oxide is minimized, and capacitor layout is simplified.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

A preferred embodiment of the present invention will now be described in detail with reference to the accompanying drawings, in which well-known circuits are shown in block diagram form in order not to obscure the present invention. In the following description, a specific analog-to-digital converter, upon which a preferred embodiment of the present invention is implemented, is set forth in order to provide a thorough understanding of the present invention. However, it will be apparent to those skilled in the art that the scope of the present invention is by no means limited thereto.

Figure 7:
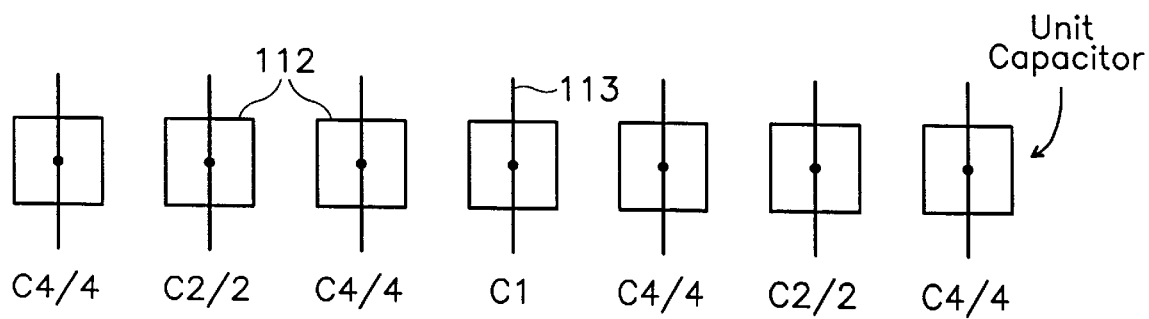
FIG. 7 is a block diagram for explaining a novel switched-capacitor array layout according to the present invention.

FIG. 7 is a block diagram of a novel switched-capacitor array layout according to the present invention. As can be seen in the figure, capacitors 112 are arranged in a lateral configuration. Preferably, the capacitor arrays are configured in lateral rows laid out in parallel to a switch array (described below—see FIG. 8) such that each of the interconnection metal lines 113 running therebetween have a substantially uniform length. The lateral layout substantially eliminates the top-plate parasitic error due to the metal interconnections and metal overlap, as well as the aforementioned oxide thickness gradient and edge-definition errors.

Figure 8:
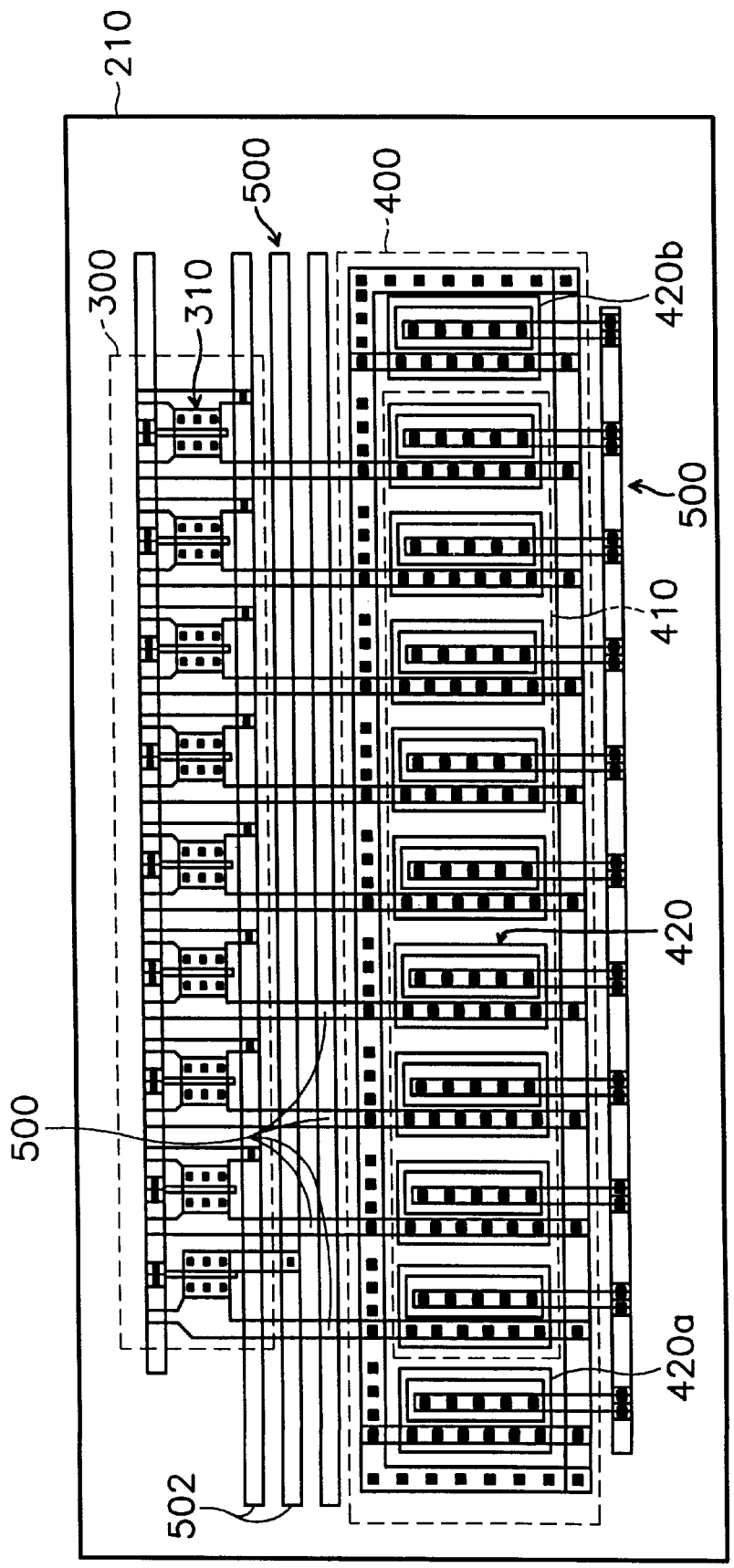
FIG. 8 is a schematic diagram of a novel switched-capacitor array layout according to the present invention.

FIG. 8 is a schematic illustration of a preferred embodiment of a novel switched-capacitor array layout according to the present invention. The switched-capacitor array 210 comprises an array 300 of nine switches 310 and nine identical capacitors 420 within dashed line 410. The switches 310 are configured and arranged along a row as shown. The unit capacitor array 410 is laid out in parallel to the switch array 300, i.e., in a parallel row, and each individual capacitor 420 is positioned to correspond with an individual switch 310. The capacitor array 400 further includes two secondary, or dummy capacitors 420a and 420b which are laid out on the both sides of primary capacitors 410, respectively. Each of secondary capacitors 420a and 420b is preferably the same size as a unit capacitor. The switched-capacitor array 210 further comprises a plurality of interconnection lines 500, each being coupled between a corresponding switch 310 and capacitor 420 pair. The switches 310 and capacitors 420, 420a and 420b can optionally be formed of either MOS (metal oxide semiconductor) devices or BICMOS devices wherein CMOS (complementary metal oxide semiconductor) devices are merged with bipolar devices.

The capacitor layout of the invention can be preferably implemented in either unit capacitor array structures or binary-weighted capacitor array structures by merely varying the switch wiring. For example, if a capacitance of C2 (i.e., 2×C1) is desired, then two switches corresponding to two unit capacitors are coupled together along horizontal conductor 502, and for the case of a capacitance of C4 (i.e., 4×C1), four switches corresponding to four unit capacitors are coupled together at conductor 502. Alternatively, desired capacitors can be commonly coupled to one of corresponding switches.

Modern advanced electronic circuitry, such as that employed by a scanner, a high-definition television, a camcorder, a medical image processor or a radar system, demands analog-to-digital converters exhibiting high resolution, high accuracy, excellent linearity, and high speed. Since a monolithic integrated circuit consumes relatively low power and occupies relatively small area, a pipelined multi-stage analog-to-digital converter (ADC) has been widely used for high speed analog-to-digital conversion. Examples of these types of ADCs are described, for example, in U.S. Pat. Nos. 4,745,394 ("Pipelined A/D converter"), 5,043,732 ("Analog-To-Digital Converter Employing A Pipeline Multi-stage Architecture"), 5,157,398 ("A/D Convertor Of The Pipeline Type Having Additional Comparators For Use In Setting A Specified Reference Voltage"), and 5,499,027 ("Digitally Self-calibrating Pipeline Analog-To-Digital Converter"), each of which is incorporated herein by reference.

Figure 1:
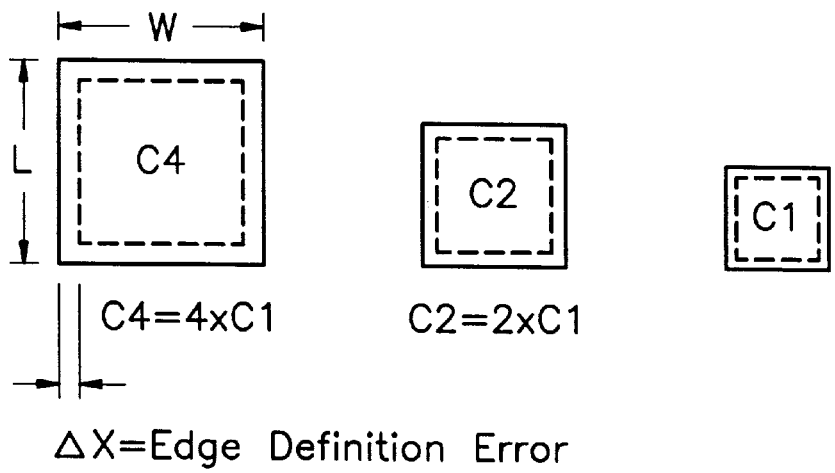
FIG. 1 is a block diagram illustrating conventional direct area scaling of a capacitor array layout and resulting edge definition error $\Delta X$.
Figure 2:
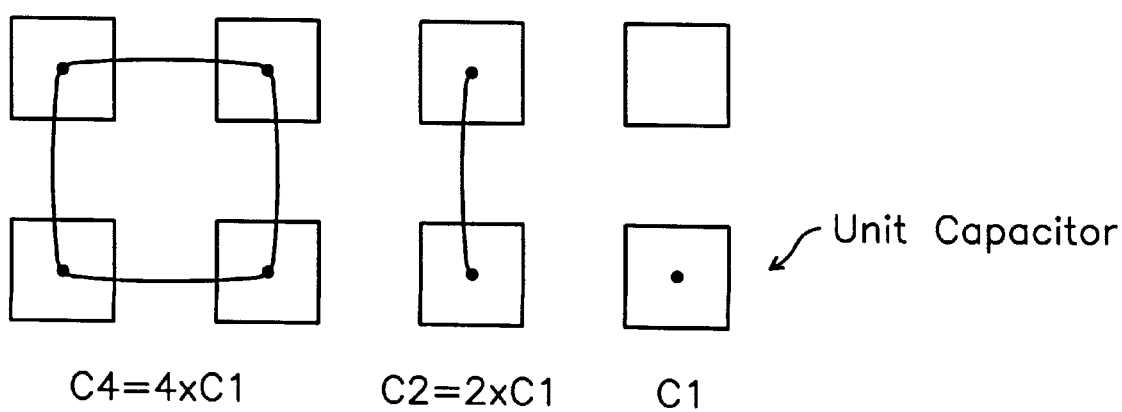
FIG. 2 is a block diagram illustrating a conventional capacitor array layout for initiating edge definition error.
Figure 3:
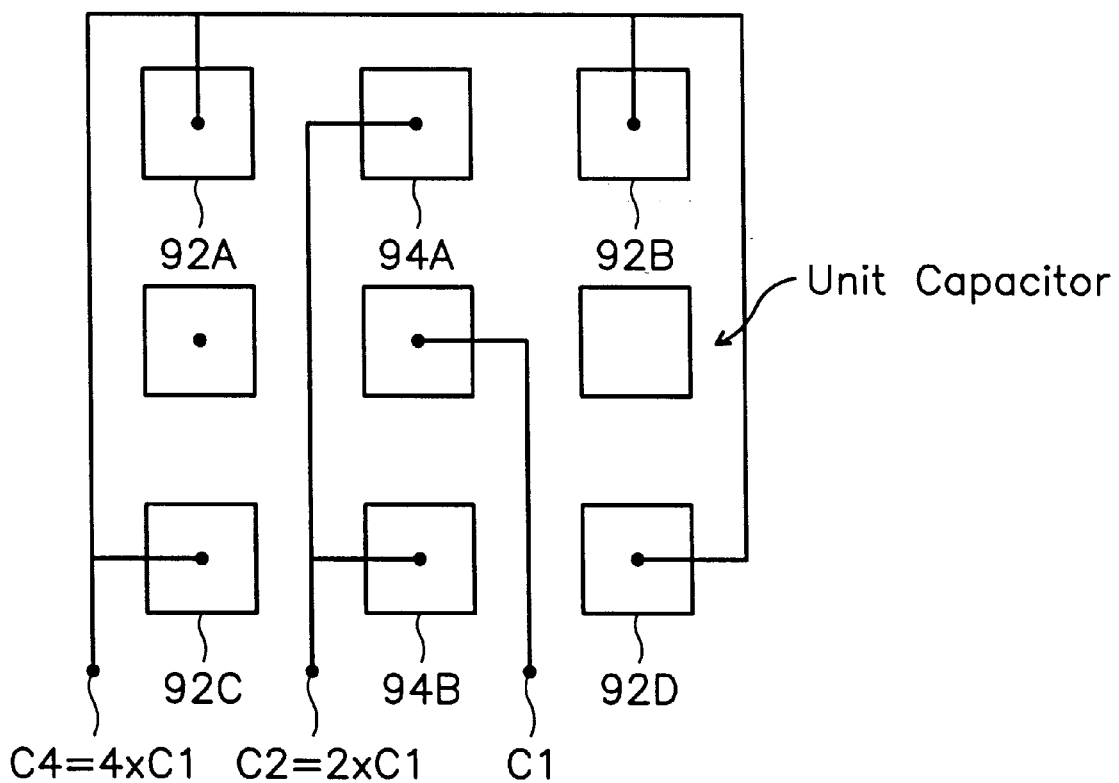
FIG. 3 is a block diagram illustrating a conventional capacitor array layout employing common centroid geometry.
Figure 4:
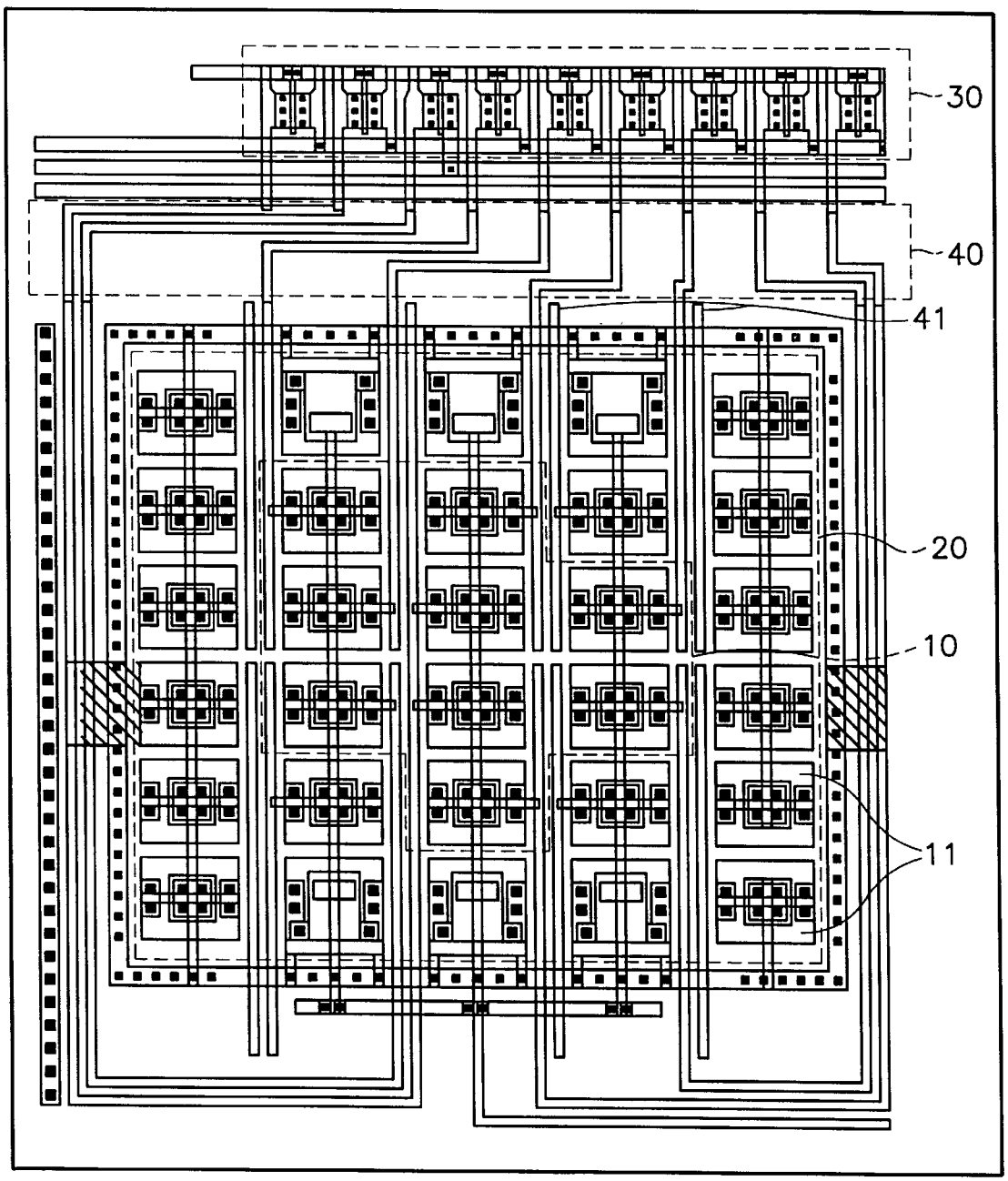
FIG. 4 is a schematic diagram of the layout of FIG. 3.
Figure 5:
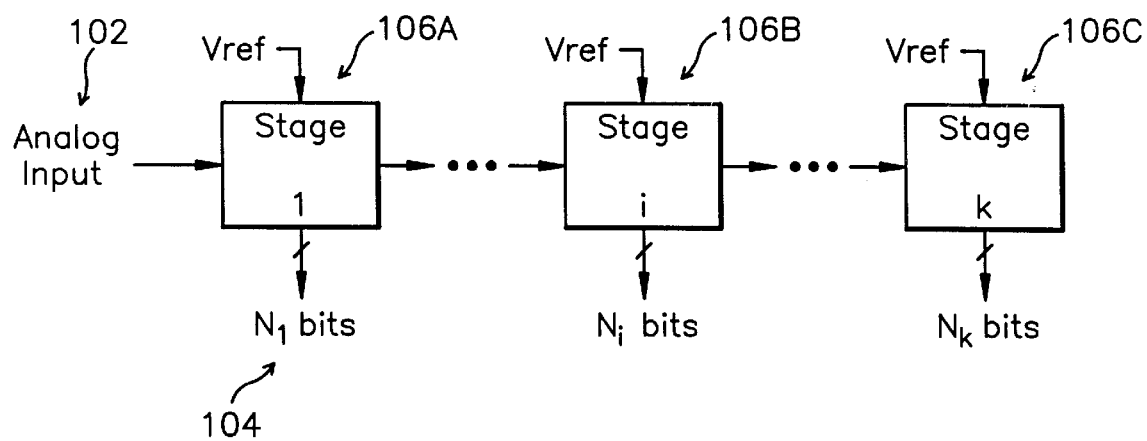
FIG. 5 is a block diagram of a multiple-stage pipelined analog-to-digital converter incorporating a capacitor array in accordance with a preferred embodiment of the present invention.

An exemplary multi-stage (i.e., k-stage) pipelined ADC for converting an analog input signal 102 into a digital output signal 104, into which the switched-capacitor array according to this embodiment of the present invention can be implemented, is shown in FIG. 5. Each stage 106A, 106B, 106C is identical, and a detailed circuit of each stage is shown in the schematic block diagram of FIG. 6.

Figure 6:
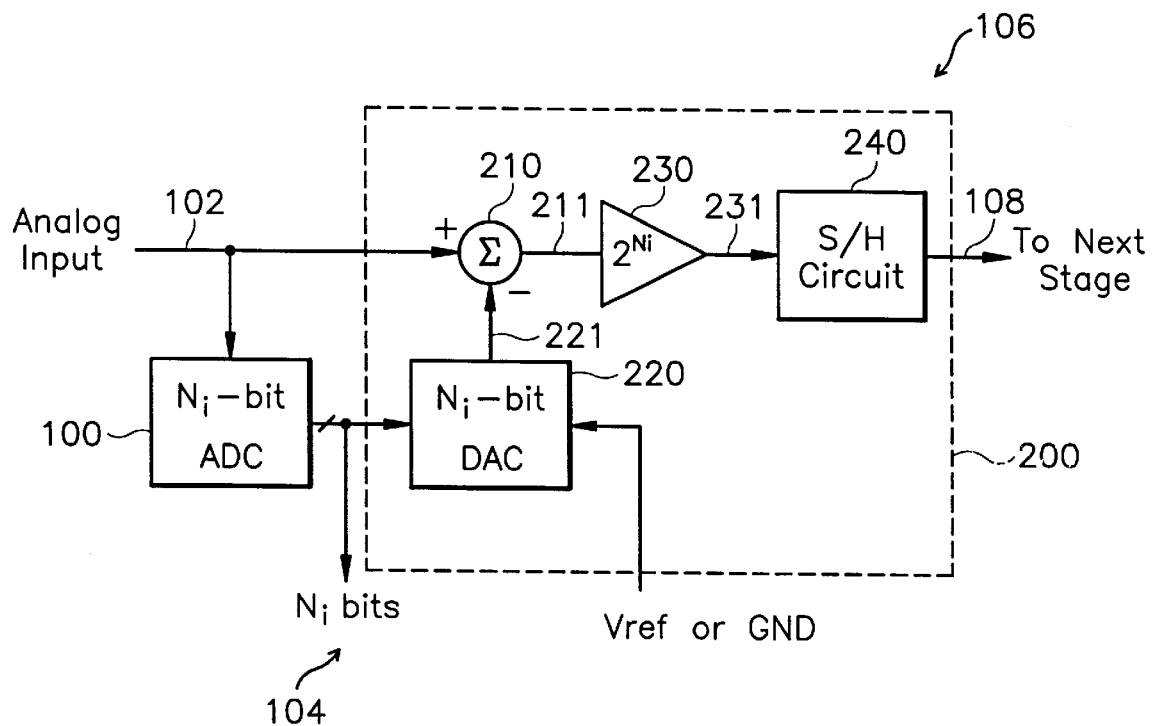
FIG. 6 is a schematic circuit diagram of a stage in the multi-stage pipelined analog-to-digital converter shown in FIG. 5, in accordance with the present invention.

Referring now to FIG. 6, each stage 106 of the ADC of FIG. 5 comprises a low resolution flash ADC 100 for receiving an analog input signal 102 and for providing an $N_i$-bit digital signal 104. A low resolution digital-to-analog converter (DAC) 220 converts the $N_i$-bit digital signal 104 into a subtrahend analog signal 221 using reference potential Vref or ground potential GND. A subtractor 210 reduces the amplitude of the analog input signal 102 by that of the subtrahend signal 221. A residue amplifier (i.e., error amplifier) 230 amplifies the reduced analog input signal 221, and a sample and hold (S/H) circuit 240 samples the amplified signal 231. The output of the S/H circuit 240 is coupled to an adjacent stage 108.

In each pipelined stage, the subtractor 210 can be implemented by a binary-weighted capacitor array (BWCA) as well as by a unit capacitor array (UCA), and thus the lateral BWCA according to this invention (FIG. 8) is well suited for subtractor 210. The circuit portion represented by reference numeral 200, including all components except for the ADC 100, can be replaced by a single multiplying digital-to-analog converter (MDAC). The BWCA-based MDAC is driven by an encoded digital input while the UCA-based MDAC can be directly driven by a decoded digital input.

During a sampling phase, an analog input signal 102 is sampled via the capacitor array 210 and a sampled output is then transmitted to the next stage. During an amplification phase, respective capacitors are switched to Vref or GND depending on digital bits corresponding to the sampled analog voltage. A residue voltage, i.e., the difference between the sampled input signal and the reconstructed analog output signal is amplified by $2^{Ni}$ and is transmitted to the next stage.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A switched-capacitor array device layout comprising:
    a plurality of switches arranged along a first linear row;
    a like plurality of capacitors of uniform geometry arranged in a second linear row extending substantially parallel to said first linear row; and
    a like plurality of interconnection lines of substantially uniform length, each line being coupled between a corresponding switch and capacitor.

2. The switched-capacitor array device layout of claim 1 wherein the interconnection lines extend in a direction substantially transverse to the first and second rows.

3. The switched-capacitor array device layout of claim 1 further comprising coupling lines extending in a direction parallel to the first and second rows for selectively coupling groups of said switches.

4. The switched-capacitor array device layout of claim 3 wherein the coupling lines are positioned between the first and second rows.

5. The switched-capacitor array device layout of claim 1 further comprising at least two secondary capacitors positioned on both sides of said capacitor array, respectively.

6. The switched-capacitor array device layout of claim 1 wherein said switches and capacitors are formed of MOS devices.

7. The switched-capacitor array device layout of claim 1 wherein said switches and capacitors are formed of BIC-MOS devices.

8. The switched-capacitor array device layout of claim 1 wherein two or more of said switches are coupled together depending on a desired capacitance such that said capacitor array is operable as a binary-weighted capacitor array.

9. The switched-capacitor array device layout of claim 1 implemented in a circuit selected from the group of circuits consisting of: analog-to-digital converters; digital-to-analog converters, and switched-capacitor filters.

10. A pipelined multiple-stage analog-to-digital converter comprising:
    a plurality of analog-to-digital stages for analog-to-digital conversion of signals, each stage comprising:
        a low resolution analog-to-digital converter for receiving an analog input signal and providing an $N_i$-bit digital signal;
        a low resolution digital-to-analog converter for converting the $N_i$-bit digital signal into a subtrahend analog signal by using a reference potential;
        a switched-capacitor array for reducing the analog input signal by the subtrahend signal;
        a residue amplifier for amplifying the reduced analog input signal; and
        a sample and hold circuit for sampling and holding the amplified signal and providing the sampled signal to next stage;
    said switched-capacitor array including a plurality of switches arranged in series in a predetermined direction, an array of a plurality of unit capacitors arranged in series in said predetermined direction, each capacitor being equal in size, and a plurality of interconnection lines each being coupled between a corresponding switch and a corresponding capacitor, whereby each of said interconnection lines has a uniform length.

11. The converter of claim 10 wherein the interconnection lines extend in a direction substantially transverse to the first and second rows.

12. The converter of claim 10 further comprising coupling lines extending in a direction parallel to the direction of the switch array and the capacitor array for selectively coupling groups of said switches.

13. The converter of claim 12 wherein the coupling lines are positioned between the switch array and the capacitor array.

14. The converter of claim 10 further comprising at least two secondary capacitors positioned on both sides of said capacitor array, respectively.

15. The converter of claim 10 wherein said switches and capacitors are formed of MOS devices.

16. The converter of claim 10 wherein said switches and capacitors are formed of BiCMOS devices.

17. The converter of claim 10 wherein two or more of said switches are coupled together depending on a desired capacitance such that said capacitor array is operable as a binary-weighted capacitor array.

* * * * *